(12) United States Patent
Buijsse et al.

(10) Patent No.: US 11,101,101 B2
(45) Date of Patent: Aug. 24, 2021

(54) LASER-BASED PHASE PLATE IMAGE CONTRAST MANIPULATION

(71) Applicant: FEI Company, Hillsboro, OR (US)

(72) Inventors: Bart Buijsse, Eindhoven (NL); Bas Hendriksen, Eindhoven (NL); Pleun Dona, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/855,536

(22) Filed: Apr. 22, 2020

(65) Prior Publication Data

US 2020/0365366 A1 Nov. 19, 2020

Related U.S. Application Data

(60) Provisional application No. 62/848,474, filed on May 15, 2019.

(51) Int. Cl.
| | |
|---|---|
| *H01J 37/22* | (2006.01) |
| *H01J 37/147* | (2006.01) |
| *H01J 37/28* | (2006.01) |
| *H01J 37/26* | (2006.01) |

(52) U.S. Cl.
CPC ........ *H01J 37/222* (2013.01); *H01J 37/1472* (2013.01); *H01J 37/226* (2013.01); *H01J 37/263* (2013.01); *H01J 37/28* (2013.01); *H01J 2237/221* (2013.01); *H01J 2237/2482* (2013.01); *H01J 2237/2614* (2013.01); *H01J 2237/2802* (2013.01)

(58) Field of Classification Search
CPC ........ H01J 37/222; H01J 37/28; H01J 37/226; H01J 37/1472; H01J 37/04; H01J 37/263; H01J 2237/221; H01J 2237/2482; H01J 2237/2614; H01J 2237/2802; G01N 23/20008; G01N 23/20058; G01N 23/2055; G01N 23/207; G01N 2223/0565; G01N 2223/0566; G01N 2223/102; G01N 2223/418
USPC ....................................................... 250/311
See application file for complete search history.

(56) References Cited

U.S. PATENT DOCUMENTS

| | | |
|---|---|---|
| 2002/0148962 A1 | 10/2002 | Hosokawa et al. |
| 2010/0108882 A1* | 5/2010 | Zewail ............... H01J 37/26 250/307 |
| 2011/0022079 A1 | 9/2011 | Reed |
| 2013/0037712 A1 | 2/2013 | Glaeser et al. |
| 2018/0286631 A1 | 10/2018 | Axelrod et al. |

OTHER PUBLICATIONS

EP20174128.7, Extended European Search Report, dated Oct. 12, 2020, 10 pages.
Schwartz O et al: "Laser control of the electron wave function in transmission electron microscopy", ARXIV.Org, Cornell University Library, 201 Olin Library Cornell University Ithaca, NY 14853, Dec. 11, 2018 (Dec. 11, 2018), XP080991868, 19 pages.

* cited by examiner

*Primary Examiner* — Kiet T Nguyen

(57) ABSTRACT

Methods and systems for implementing laser-based phase plate image contrast enhancement are disclosed herein. An example method at least includes forming at least one optical peak in a diffraction plane of an electron microscope, and directing an electron beam through the at least one optical peak at a first location, where the first location determines an amount of phase manipulation the optical peak imparts to an electron of the electron beam.

25 Claims, 6 Drawing Sheets

LASER-BASED PHASE PLATE IMAGE CONTRAST MANIPULATION

This application claims the benefit of Provisional Application No. 62/848,474, filed May 15, 2019, which is incorporated by reference herein.

FIELD OF THE INVENTION

The invention relates generally to image contrast enhancement, and specifically to phase-based image contrast enhancement in electron microscopes.

BACKGROUND OF THE INVENTION

Images acquired in a transmission electron microscope (TEM) may suffer from poor contrast, or at least exhibit non-ideal contrast. For example, soft materials, such as biological samples, may impart little to no phase change to passing electrons. In such a case, acquired images may contain little to no information. While soft materials may present the biggest image problems, even materials that provide meaningful phase change to the passing electrons may still result in, upon imaging, non-desirable images. To acquire richer, more useful images in TEMs, it is desired to improve image contrast.

Prior attempts at providing such contrast enhancement used a phase plate located at the back focal plane, for example. However, such phase plates have not provided the desired outcome, nor have they given practical solutions. These prior techniques center on providing additional phase change to electrons after passing through a sample, but suffer from various problems. One of the various problems is a lack of tunability, prior techniques typically provide a set amount of phase change and are not able to provide a tunable amount of phase shift. For example, a thin-film Zernike phase plate has a fixed phase shift, which is directly related to the film material, thickness, and beam energy. Another of the various problems concerns the physical nature of the previous techniques, which limits their lifetimes as well as the amount of phase change they may impart. Another problem is the inevitable scattering loss by the phase plate. While these prior techniques have provided some results, a tunable, loss-free, non-material technique is desired.

SUMMARY

Methods and systems for implementing laser-based phase plate image contrast enhancement are disclosed herein. An example method at least includes forming at least one optical peak in a diffraction plane of an electron microscope, and directing an electron beam through the at least one optical peak at a first location, where the first location determines an amount of phase manipulation the optical peak causes to an electron of the electron beam An example system may at least include an electron source coupled to provide an electron beam, one or more deflectors coupled to reposition the electron beam in response to a control signal, an optical source coupled to provide an optical beam, the optical beam a high energy optical beam, an optical cavity coupled to receive the optical beam and to form at least one optical peak within the optical cavity, the optical cavity arranged at a diffraction plane of an electron microscope, and a controller coupled to at least the one or more deflectors, the controller including or coupled to a non-transitory computer readable medium including code that, when executed by the controller, causes the controller to direct, by the one or more of the deflectors, the electron beam through the at least one optical peak at a first location, wherein the first location determines an amount of phase manipulation the optical peak causes to an electron of the electron beam, and wherein the first location located in relation to a peak intensity location of the optical peak.

BRIEF DESCRIPTION OF THE DRAWINGS

Like reference numerals refer to corresponding parts throughout the several views of the drawings.

DETAILED DESCRIPTION OF EMBODIMENTS

Figure 1A:
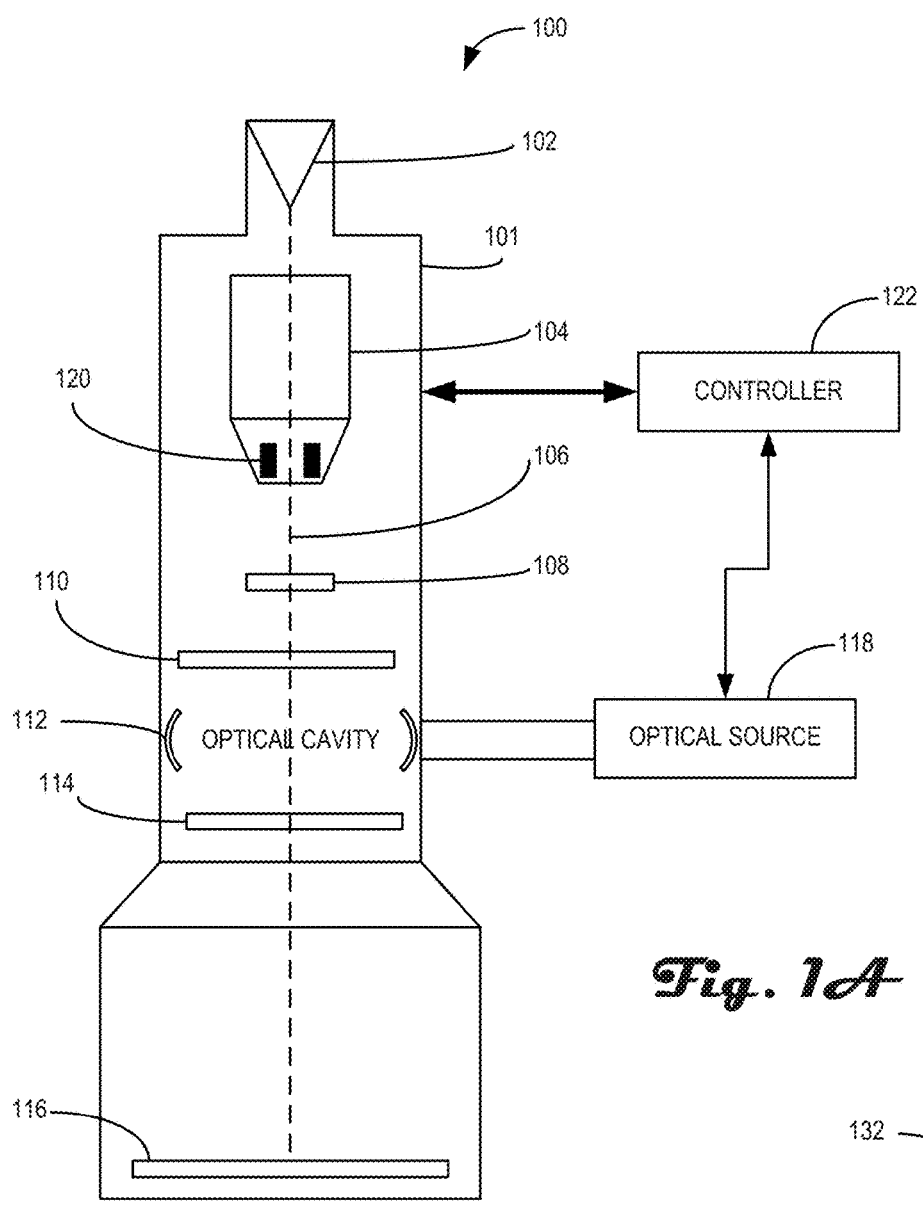
FIG. 1A is an example of an electron microscope system in accordance with an embodiment of the present disclosure.

Embodiments of the present invention relate to contrast enhancement of electron microscope images. In some examples, an electron beam is passed through an area of intense optical energy to change the phase of electrons, such as unscattered electrons, the changed phase providing enhanced contrast of acquired images. The intense optical energy may be part of an optical standing wave or an optical pulse where the location the electron beam passes through the optical peak determines the amount of phase change the electrons receive. In some embodiments, the location corresponds with a peak intensity and the phase change is as much as $\pi/2$. In other embodiments, the location is at a location of less optical power than at a peak and the phase change is less. Other examples include scanning the electron beam across multiple peaks of an optical standing wave or in and out of the optical standing wave to manipulate the phase change in different ways. Each embodiment, however, may allow for image contrast manipulation, such as enhancement.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Additionally, in the following discussion and in the claims, the terms "including" and "comprising" are used in an open-ended fashion, and thus should be interpreted to mean "including, but not limited to . . . ."

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

As discussed above, there is a desire in industry and academia to improve contrast in TEM images. Past techniques to provide enhanced image contrast through phase change of the electron beam have provided some success, but are limited in important ways. Such prior techniques include thin-film Zernike phase plates, Volta phase plates, electrostatic phase plates, and even laser-based phase plates. The thin-film Zernike phase plates have a fixed phase shift, which is directly related to the film material, thickness and electron beam energy. As a result, this type of phase plate provides no tunability and must be designed to provide a single amount of phase change using the listed parameters. While this may be useful in very narrow situations, the lack of flexibility prevents widespread adoption. The Volta phase plate gradually develops a phase shift to some asymptotic value that is related to hard to control surface conditions of a film. Although the phase gradually changes, such change without control provides no tuneability. The electrostatic phase plates can in principle provide some limited tuneability, but they usually produce major artefacts in acquired images which reduces their usefulness. Lastly, prior laser phase plates can provide some tuneability by changing the laser power, but the changes take a long time to stabilize, on the order of an hour for example, which limits their practicality. As such, the desire for easily implementable, phase change techniques that provide flexibility in the amount of phase change imparted to passing electrons is desirable.

One solution to this problem is a laser phase plate using the ponderomotive potential associated with a strong laser field. Ponderomotive potentials can be strong enough to impart a significant phase shift to even 300 KeV electrons, and, depending on the strength of the potential experienced by the electrons, can impart up to $\pi/2$ phase change. Additionally, the laser-based phase plate disclosed herein is immaterial—meaning it has not physical structure that interacts with the electron beam. The immaterial aspect is fundamentally different from the other material-based phase plate techniques discussed above, and offers new opportunities to manipulate, e.g., enhance, image contrast.

The disclosed solution may be used in numerous techniques to enhance image contrast. In one embodiment, unscattered electrons that pass through a sample may be directed to pass through an anti-node, e.g., high energy location, of an optical pulse. The optical pulse either being a single pulse or one optical peak, e.g., an anti-node, of an optical standing wave. Depending on the location where the electrons pass through the high-intensity electromagnetic field of the optical pulse/optical peak, a different amount of phase change may be imparted to the electrons. In general, the location may be referenced to a peak optical intensity of the optical pulse, see FIG. 1C for example. If the location coincides with the peak intensity, then a maximum amount of phase change, e.g., $\pi/2$, may be imparted. If the location is at a different location having reduced optical power intensity, then the phase change will be less. In other embodiments, the unscattered electrons may be moved to pass through different parts of an optical standing wave, such as through multiple peaks and valleys, and/or in and out of the optical standing wave. In any of the discussed embodiments, the phase change experienced by the unscattered electrons enhances the image contrast. In general, the image contrast is enhanced due to the relative change in phase between the unscattered electrons and the scattered electrons. By increasing the relative difference, image contrast is enhanced.

As noted above, the unscattered electrons can be statically passed through a desired area of optical power, e.g., a set location on an optical peak, or dynamically passed through one or more optical peaks to dynamically change the amount of phase change. These techniques are used to enhance image contrast in a number of example situations. One situation involves samples that are strong phase objects, e.g., samples that already impart phase change to the unscattered electrons. In such a situation, the amount of desired phase change may be small, e.g., less than 0.5 radians, which can be achieved by placing the beam of unscattered electrons at a falling edge of an anti-node, e.g., location 231 of FIG. 2B. On the other hand, if the sample is a weak phase object, e.g., a soft biological material, the electrons may be passed through the location of peak optical power so that maximum phase change is imparted on the electrons. As used herein and when discussing phase change, the term "electrons" refers to the unscattered electrons.

Another situation involves image resolutions where Thon rings start to show oscillating behavior with multiple zero transitions. Spatial frequencies of the sample that correspond with these transitions will have zero contrast transfer, which is undesirable. By shifting the electron beam from an anti-node to a node, the Thon ring modulations will shift such that minima (zero transitions) become maxima, and vice versa (see FIG. 3C). During data acquisition, half the acquisition period can be performed with the electron beam at an anti-node and the second half with electron beam at a node. Subsequently, adding the two images, after correction for contrast reversals, results in an image without zero contrast frequencies in the contrast transfer function.

Figure 4A:
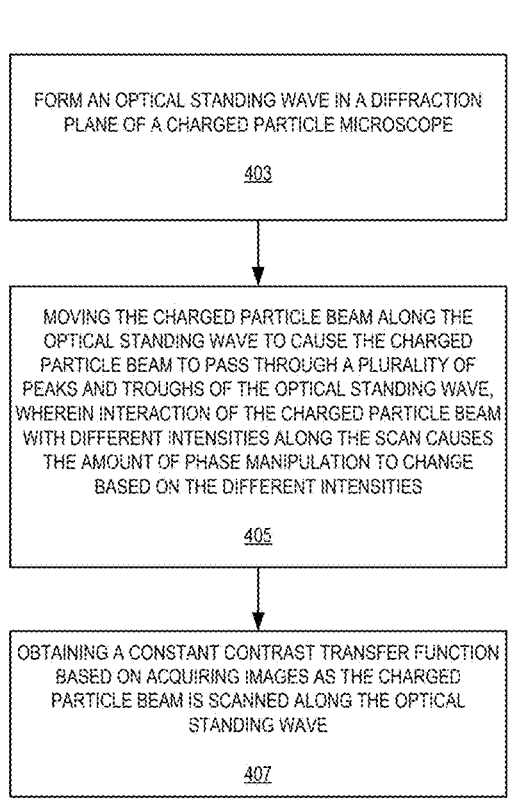
FIG. 4A is an example method for obtaining a constant contrast transfer function in accordance with an embodiment of the present disclosure.
Figure 4B:
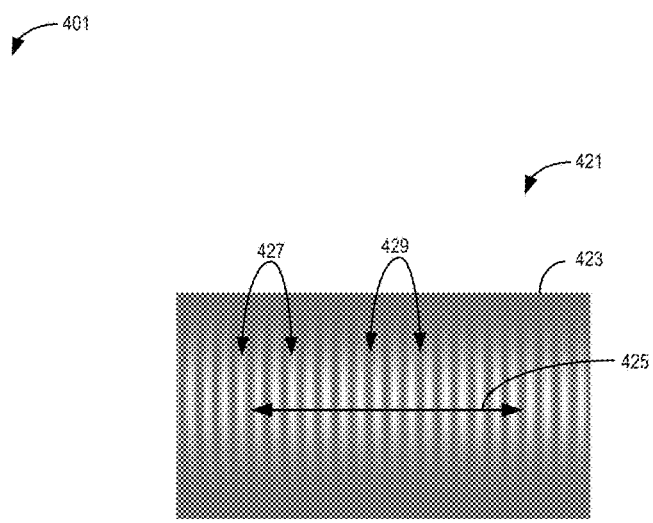
FIG. 4B is an example illustration of a standing optical wave arranged in a diffraction plane of an electron microscope and an example scan path of an electron beam.

And yet another solution involves applying a shift (harmonic, linear, or some jitter function) of the electron beam such that it is passing through the standing optical wave over a number of nodes/anti-nodes during an acquisition (see FIG. 4B). After averaging all acquired images, a constant contrast transfer is obtained up to the point resolution. This technique, however, may not provide the desired results at high resolution, such as 3A and even higher resolution.

FIG. 1A is an example electron microscope system 100 in accordance with an embodiment of the present disclosure. The electron microscope system 100, which may be referred to simply as an electron microscope 100 herein, may be used to acquire images of various materials by directing a beam of electrons toward a sample and detecting electrons that pass through the sample. Depending on the sample material, the electrons passing through the sample may undergo energy loss and/or phase change due to interactions with the sample. For samples that impart little phase change to the passing electrons, the electron microscope 100 includes an optical-based phase change plate to impart additional phase manipulation to the electrons that pass through the sample. The additional phase manipulation may improve the contrast of acquired images. For samples that are strong phase objects, the electron beam may experience, e.g., need, less phase change to enhance imaging.

In most embodiments, the electron microscope 100 is a transmission electron microscope (TEM), but other electron microscope types are also contemplated, such as STEMs and/or SEMs. In general, the electron microscope 100 may at least include a source 102, a collimator 104, a sample holder 108, a first lens 110, an optical cavity 112, a second lens 114, and a detector 116, some of which may be arranged in a column 101. The optical cavity 112 may be provided optical energy from an optical source 118. Additionally, a controller 122 is coupled to the various components of the electron microscope 100 to control their functioning and to receive data from the detector 116 when acquiring images. In general, the source 102 may provide an electron beam that is directed toward a sample held by the sample holder 108. The electrons pass through/traverse the sample and are then directed by one or both of the lenses 110, 114 toward the detector 116. The electrons impinging the detector 116 may then be used to form one or more images of the sample.

The source 102 may be an electron gun source, such as a Schottky emitter or a cold field emission gun, but other source types are also contemplated herein.

The collimator 104 may include one or more lenses, collimators, and/or energy filters used alone or in concert to condition the electron beam. The collimator may condition the electron beam so to expose the sample with a desired quality of electron beam, such as a desired spot size, coherence, shape, etc. In addition, the deflectors 120 included in the collimator 104 may be controlled by the controller to deflect a location the electron beam interacts with the sample and/or traverses the optical cavity.

The first lens 110 may be an objective lens arranged to collect the electrons having traversed a sample held by the sample holder 108 and project them toward the detector 116. In some embodiments, the first lens 110 may be formed from a plurality of separate lenses. In any embodiment, however, the lenses may be either electrostatic or magnetic.

Figure 1B:
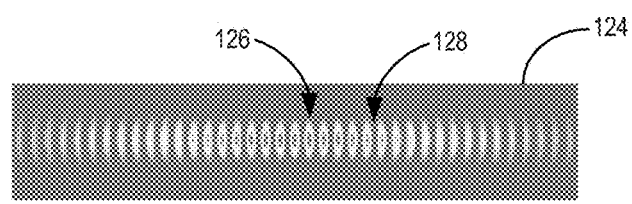
FIG. 1B is an example of a standing wave in accordance with an embodiment of the present disclosure.
Figure 1C:
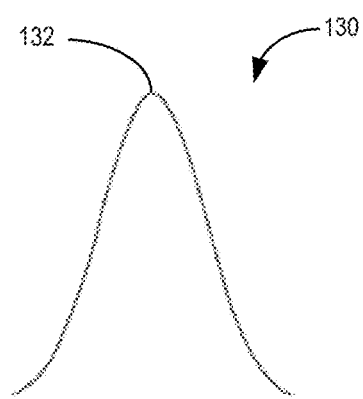
FIG. 1C is an example of an optical peak in accordance with an embodiment of the present disclosure.

The optical cavity 112 may be any type of optical cavity that can receive high intensity optical energy and form either a single optical peak, see FIG. 1C, or an optical standing wave, see FIG. 1B. In some embodiments, the optical cavity 112 may be a Fabry-Perot optical cavity. In such embodiments, the Fabry-Perot cavity may receive the high intensity optical energy and establish an optical standing wave of a desired energy in the anti-nodes, e.g. peaks, of the standing wave. The optical cavity 112 may be arranged in the diffraction plane of the electron microscope system 100. The diffraction plane may also be referred to at times as the back focal plane of the electron microscope system 100. In other embodiments, the optical cavity 112 may be located at a desired conjugate of the diffraction plane, such as 4, 5, or 6 times magnification, which may allow the use of the optical standing wave/optical pulse in an enlarged diffraction plane and reach the desired phase change in a smaller area in reciprocal space.

The second lens 114 may be a transfer lens to direct the electron beam after passing through the optical cavity to the detector 116. Like the first lens 110, the second lens 114 may be formed from multiple lenses in some embodiments.

The detector 116 may be arranged to receive the electron beam post traversing the sample so that images are acquired. The detector 116 may be a solid state charged particle detector or an optical detector having a scintillator covering the imaging aperture. Regardless of detector type, the detector 116 may acquire image data based on impinging electrons, and transfer the image data to the controller or a separate computer for image formation and/or manipulation, such as subtraction or averaging of several images.

The optical source 118 may provide intense optical energy to the optical cavity through an optical port, for example. The optical source 118 may be a laser, such as a solid state laser or gas laser for example, configured to provide high optical powers to the optical cavity. In some embodiments, the optical source 118 may provide laser emission of 1064 nm wavelength to form power densities within the optical cavity 112 of 40 GW/cm$^2$ or more. The high power density may be required to impart a desired phase change to the passing electrons of the electron beam.

The optical source 118 may be configured in multiple ways. For example, in some embodiments, the optical source 118 may provide continuous wave power to the optical cavity so that an optical standing wave forms within the optical cavity 112. FIG. 1B is an example of a standing wave 124 in accordance with an embodiment of the present disclosure. The standing wave 124 may be characterized as having intensity peaks 126, which may also be referred to as anti-nodes, along with intensity troughs 128, which may also be referred to as nodes. The anti-nodes are where the optical power concentrates within the optical cavity 112 in response to the length of the optical cavity and the wavelength of the optical energy. The standing wave 124 may additionally be characterized to extend across the optical cavity 112 with a limited width such that the standing wave extends longitudinally across the optical cavity in one direction but only extends a limited distance in other radial directions. For example, the standing wave may form a tube-like standing wave that extends across the column 101 of electron microscope system 100 in one direction but falls off in intensity in a perpendicular direction. The exact profile depends on the numerical aperture (NA) that can be realized in the cavity.

In another example operation, the optical source 118 provides optical pulses. In such an embodiment, the optical cavity may not be necessary, and the optical pulses may be provided to a desired location along the column 124, such as the back focal plane or a conjugate thereof. The optical pulses may establish at least one high intensity peak within the optical cavity 112. FIG. 1C is an example of an optical peak 130 in accordance with an embodiment of the present disclosure. The optical pulse 130 may have a single peak 132 that may form a three-dimensional Gaussian shape. In the optical pulse configuration, the controller 122 may time the passing of the charged particle beam with the formation of the optical pulse 130 to cause a desired amount of phase change.

In operation, the electron microscope system 100 may be controlled by the controller 122 to deflect the electron beam 106 to pass through at least one optical peak after passing through a sample on sample holder 108. The electron beam passes through the at least one optical peak, either in a standing wave or in a pulse, in a desired location with respect to a peak intensity location, e.g., antinode, to cause a desired amount of phase change/shift to the electrons of the electron beam 106. In some embodiments, the electron beam 106 may be directed by deflectors 120 to a desired location and left there during image acquisition of a sample, such as a weak phase object. In other embodiments, the controller 122 may control the deflectors 120 to move the electron beam to multiple locations of varying optical intensity to vary the amount of phase change imparted onto the electrons of the electron beam 106. The various locations of interaction between the electron beam and the optical energy will be discussed below in more detail. In general, the passing of the electron beam through the optical energy, such as through a peak intensity location of an anti-node of the standing wave, may cause as much as a quarter wave of phase change. Such phase change may provide for enhanced contrast imaging of low contrast materials, such as biological samples, and/or stronger phase materials.

Figure 2A:
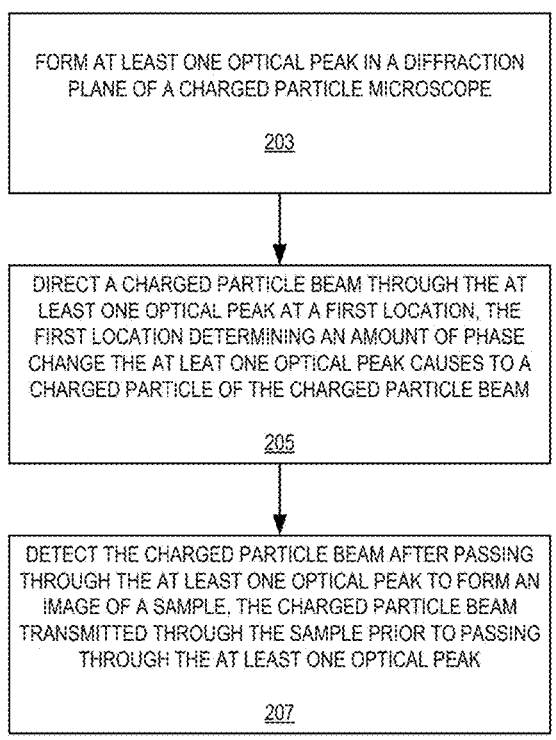
FIG. 2A is an example method for changing the phase of an electron beam a desired amount in accordance with an embodiment of the present disclosure.

FIG. 2A is an example method 201 for changing the phase of an electron beam a desired amount in accordance with an embodiment of the present disclosure. The method 201 may be implemented on an electron microscope, such as electron microscope 100 for example, and may allow a user to determine how much phase change to impart on electrons of the electron microscope when imaging materials. For example, a TEM may pass a beam of electrons through a laser-based phase plate to manipulate the phase of the electrons in the electron beam when imaging materials, such as biological samples.

The method 201 may begin at process block 203, which includes forming at least one optical peak in a diffraction plane of the electron microscope. In some embodiments, the at least one optical peak is formed from an optical pulse provided to a diffraction plane of the microscope, which optionally includes some form of optical cavity. In other embodiments, the at least one optical peak is part of an optical standing wave established in an optical cavity arranged at the diffraction plane. In either embodiment, a high intensity optical source, e.g., a laser, is used to generate the optical pulse or the optical standing wave.

Process block 203 may be followed by process block 205, which includes directing an electron beam through the at least one optical peak at a first location. The first location determines an amount of phase change the at least one optical peak causes to an electron of the electron beam. In some embodiments, the first location is referenced to a peak intensity location of the at least one optical peak. For example, a varying amount of phase change from a maximum to zero may be experienced by the electron depending on where the electron beam traverses through the optical pulse in relation to the optical peak. A maximum amount of phase change corresponds with the peak intensity location, e.g., antinode, and less phase change corresponds with locations further away from the peak and approaching a node location of the optical standing wave. In general, the direction of the phase change in addition to the amount of phase change may be affected by the relative location where the electron beam passes through the at least one optical peak.

Figure 2B:
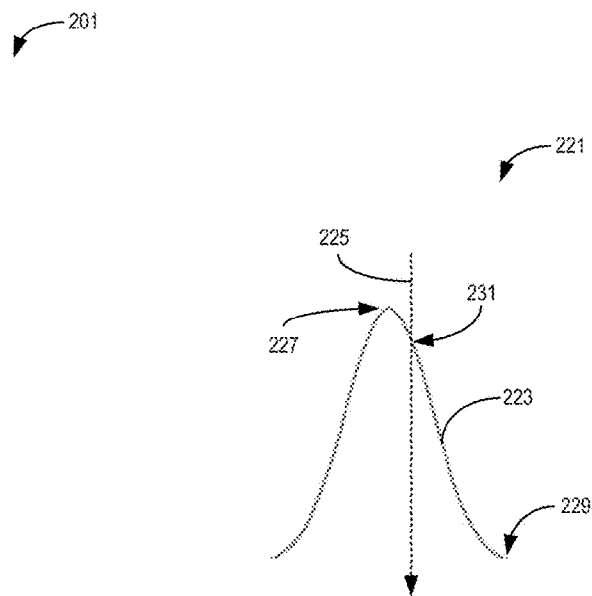
FIG. 2B is an example illustration showing an interaction location of an electron beam with an optical pulse in accordance with an embodiment of the present disclosure.

FIG. 2B is an example illustration 221 showing an interaction location of an electron beam with an optical pulse in accordance with an embodiment of the present disclosure. The illustration 221 includes the optical peak 223 and electron beam 225. The optical peak 223 has a peak intensity location 227 and a second location 229. In some embodiments, the second location 229 may correspond to a zero intensity location. However, in other embodiments, the second location 229 may correspond to an intensity greater than zero, but less than that of location 227. If the electron beam 225 passes through the optical peak 223 at the peak intensity location 227, then a maximum amount of phase change may be imparted to the electrons of the electron beam 225. For example, a phase change of $\pi/2$ may be caused. If, however, the electron beam 225 passes through the optical peak at location 231, then an amount of phase change less than the maximum may be imparted to the electrons of the electron beam 225. With regards to the second location 229, depending on the embodiment with respect to the second location, an amount and/or direction of phase change may be different. For example, if the second location corresponds to a zero intensity location, e.g., a node, then the optical peak may only cause minimal or no phase change to electrons of the electron beam 225.

Returning to FIG. 2A, process block 205 may be followed by process block 207, which includes detecting the electron beam after it has passed through the at least one optical peak. Detecting the electron beam allows for the formation of images of a sample that had been irradiated with the electron beam prior to the electron beam passing through the at least one optical peak. It should be noted that process block 207 is optional in some embodiments.

Figure 3A:
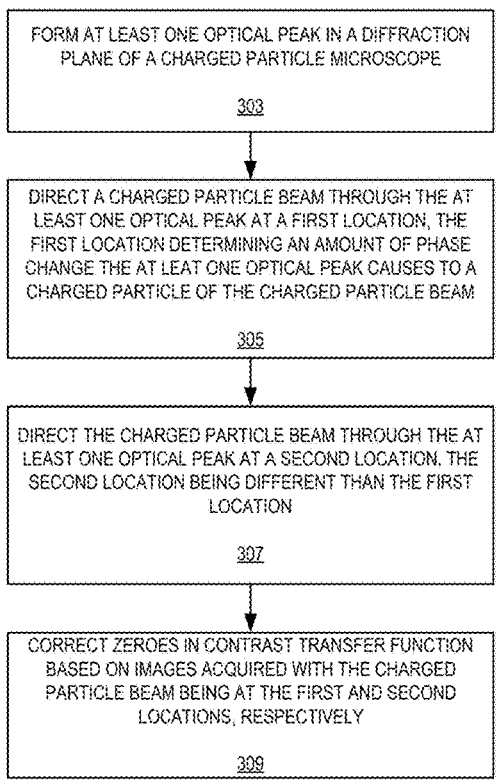
FIG. 3A is an example method for improving an image contrast transfer function in accordance with an embodiment of the present disclosure.

FIG. 3A is an example method 301 for improving an image contrast transfer function in accordance with an embodiment of the present disclosure. The method 301 may be implemented on an electron microscope, such as electron microscope system 100 for example, and may be used to correct for zeros in contrast transfer functions using phase manipulation of electrons. In some embodiments, the method 301 may be implemented in a TEM.

The method 301 may begin at process block 303, which includes forming at least one optical peak. The optical peak being formed in a diffraction plane of the charged particle microscope. In some embodiments, the at least one optical peak is formed from an optical pulse generated in the diffraction plane. In other embodiments, the at least one optical peak is part of an optical standing wave established in an optical cavity arranged at the diffraction plane. In either embodiments, a high intensity optical source, e.g., a laser, is used to generate the optical pulse or the optical standing wave.

Process block 303 may be followed by process block 305, which includes directing an electron beam through the at least one optical peak at a first location. It should be noted that the electron beam, prior to being directed through the at least one optical peak, has already traversed the sample and contain information regarding the sample. The first location determines an amount of phase change the at least one optical peak causes to an electron of the electron beam. In some embodiments, the first location is referenced to a peak intensity location of the at least one optical peak. In general, a varying amount of phase change from a maximum to zero may be experienced by the electron depending on where the charged particle beam transmits through the optical pulse in relation to the optical peak, where the maximum corresponds with the peak intensity location and less phase change corresponds with other locations. In some embodiments, the direction of the phase change in addition to the amount may be affected by the relative location where the charged particle beam passes through the at least one optical peak.

Figure 3B:
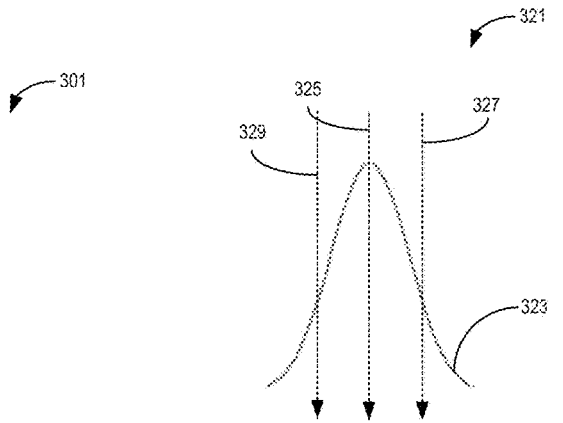
FIG. 3B is an example illustration of an optical pulse and interaction locations of an electron beam in accordance with an embodiment of the present disclosure.
Figure 3C:
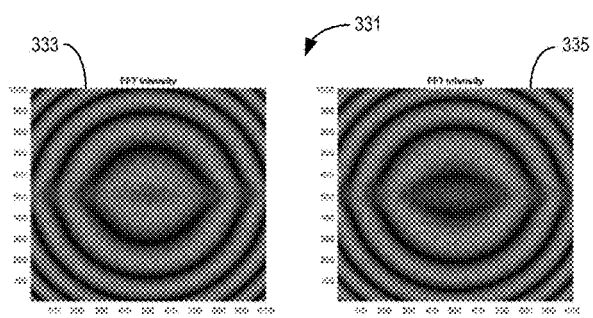
FIG. 3C are example plots of Fast Fourier Transform intensity of images acquired in accordance with at least one method disclosed herein.

The process block 305 may be followed by process block 307, which includes directing the electron beam through the at least one optical peak at a second location, the second location being different than the first location. In some embodiments, the amount of phase manipulation the optical peak causes to an electron of the electron beam at the second location being different than the amount of phase manipulation the optical peak causes to an electron of the electron beam at the first location. For example, as seen in FIG. 3B, the first location may be the peak of the at least one optical peak, as shown by the location of electron beam 325 interacting with optical peak 323, and the second location may be at a less intense location, as shown by the location of electron beam 327 interacting with optical peak 323. The locations shown in FIG. 3B are for illustrative purposes and are not intended to be limiting. In general, the first and second locations may be anywhere along the optical peak 323, and are not limited to having one at the height of intensity and the other elsewhere. In other embodiments, the second location may cause the same amount of phase manipulation as the first location but be located on either a different optical peak of a standing wave, or on an opposite side of the optical peak—see location 329 in FIG. 3B. By using a different location but with the same phase manipulation, image ghosts may be eliminated or reduced from resulting images.

Alternatively, the second location may be associated with a different optical peak than the at least one optical peak, and does not need to be associated with the same optical peak. In such an embodiment, the different, e.g., second optical peak, may have an intensity similar to or less than the at least one optical peak. In an example where the intensities of the two optical peaks are similar or the same, then the second location may be relatively different with respect to the peak intensity than the first location. On the other hand, if the two optical peaks are different in intensity, the second optical peak being less than the first for example, then the second location may coincide with the peak location of the second, less intense optical peak. In general, the desired amount of phase change imparted by the first and second locations is to be different.

In summary, the second location can be on the same optical peak but causes a different amount of phase change, or it can be on the same optical peak but cause the same amount of phase change as the first location. Alternatively, the second location can be on a different optical peak and either cause a different amount of phase change or the same amount of phase change. Lastly, the second location may be in a non-peak area, e.g., a node of an optical standing wave, and impart no phase change to the electrons. Other examples, which may include discretely or continuously moving the electron beam through, across, in and out, or randomly through the optical standing wave, will be discussed in detail below. In general, the two locations the electron beam is directed are selected so that the Thon rings (shown in FIG. 3C) are reversed, which will lead to an image using the combined acquisitions to have no or minimal zeros in a resulting contrast transfer function.

Process block 307 may be followed by process block 309, which includes correcting zeroes in a contrast transfer function based on images acquired with the electron beam being at the first and second locations, respectively. The contrast transfer function (CTF), which shows the efficiency of converting Fourier transforms of phase imparted by the specimen to the charged particle beam, may be applied to images acquired of a sample imaged by the phase-manipulated electron beam. If the electron beam undergoes a single phase manipulation, e.g., interacts with the optical peak at one location, the CTF may include zeros in the data. See the dark rings of image 333 in FIG. 3A. However, acquiring images with the electron beam interacting with the optical peak in a second location, the dark rings may turn light, see light rings of image 335 in FIG. 3B, which may provide data missing in the first image. As such, the zero or null data in one CTF may be augmented or corrected from a subsequent image by changing the location the charged particle beam interacts with the optical peak.

FIG. 4A is an example method 401 for obtaining a time-averaged constant CTF in accordance with an embodiment of the present disclosure. The method 401, which may also be implemented in an electron microscope, such as electron microscope system 100, may be similar to or an extension of method 301. For example, while method 301 discusses having an electron beam pass through an optical peak at two locations, the method 401 has the electron beam pass through multiple peaks and acquires images at different locations with respect to the multiple peaks. Instead of using method 401 to correct zeros in CTFs, the method 401 changes the location of the electron beam's passing through an optical standing wave to obtain a time-averaged constant CTF when imaging a sample. By discretely or continuously moving the electron beam through the optical standing wave, the amount of phase change the charged particle beam experiences varies with time so that a time-averaged CTF is constant.

FIG. 4B is an example illustration 421 of a standing optical wave 423 arranged in a diffraction plane of a charged particle microscope and an example path 425 of a charged particle beam. While the path 425 is shown as a straight line traversing multiple anti-nodes and nodes of the optical standing wave 423, the scan path 425 may in general be any random path through and in and out of the optical standing wave 423. The optical standing wave 423 may be formed in an optical cavity, such as a Fabry-Perot cavity, arranged in the diffraction plane of the electron microscope, and the example path 425 may indicate one possible path in which the electron beam may traverse with respect to the optical standing wave 423. FIG. 4B will be used to illustrate method 401.

The method 401 may begin at process block 403, which includes forming an optical standing wave in a diffraction plane of an electron microscope. As indicated, the optical standing wave 423 may be formed in an optical cavity arranged in the diffraction plane of the CPM.

Process block 403 may be followed by process block 405, which includes moving, either continuously or discretely, the electron beam through, along and/or in and out of, the optical standing wave to cause the electron beam to pass through a plurality of peaks and troughs of the optical standing wave. The optical peaks and troughs may also be referred to as anti-nodes and nodes of the optical standing wave. The interaction of the electron beam with different intensities along the path causes the amount of phase manipulation to change based on the different intensities of the optical standing wave the electron beam encounters. For example, as the electron beam is moved along path 425, the electron beam will pass through any desired number of anti-nodes 427 and nodes 429. As the electron beam traverses path 425, the intensity of the optical standing wave 423 encountered changed from high at anti-nodes 427 to low at nodes 429 and intermediate intensities therebetween, and this change in optical intensity interaction changes the amount and/or direction of phase change imparted on the electrons of the electron beam. As such, the change in phase to the electrons will oscillate between two limits. Images obtained at these different locations of the electron beam with respect to the optical standing wave may be added to obtain a CTF, see process block 407.

Figures 5A, 5B:
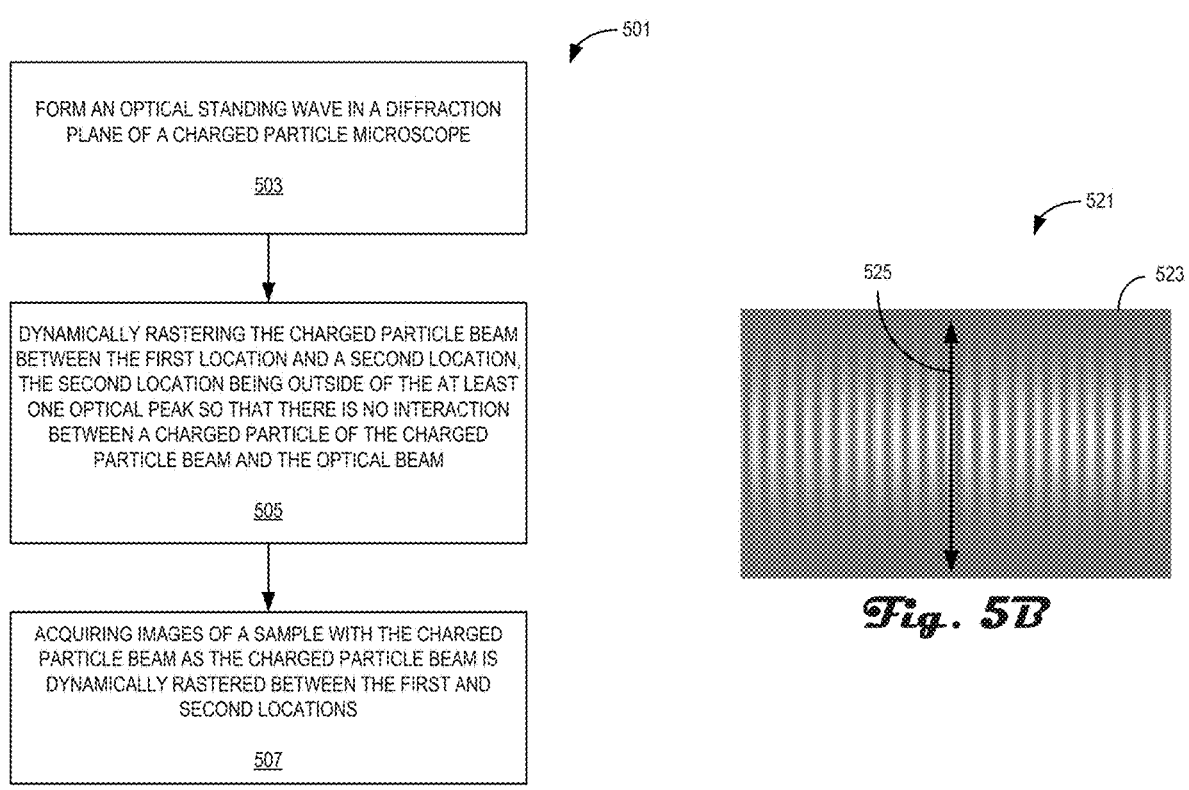
FIG. 5A is an example method in accordance with an embodiment of the present disclosure.
FIG. 5B is an example illustration of a standing optical wave arranged in a diffraction plane of an electron microscope and an example scan path of an electron beam.

FIG. 5A is an example method 501 in accordance with an embodiment of the present disclosure. The method 501, like the other methods, may be implemented in an electron microscope, such as the electron microscope system 100. The method 501 may include acquiring images of a sample with an electron beam passing through at least one optical peak at least a portion of the image acquisition. FIG. 5B is an example illustration 521 of a standing optical wave 523 arranged in a diffraction plane of an electron microscope and an example scan path 525 of an electron beam.

The method 501 may be similar to the method 401 expect instead of moving the electron beam over a plurality of peaks of the optical standing wave, the electron beam is dynamically scanned or rastered in and out of the optical standing wave (process block 505). As such, the electron beam spends some time interacting with the optical standing wave so that some phase change is experienced, and some time outside of the optical standing wave so that no phase change is experienced. While the electron beam is moved between locations of interaction and non-interaction of the optical standing waver, images of a sample may be acquired (process block 507).

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors or graphics processing units (GPUs) programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques. In some embodiments, the special-purpose computing device may be a part of the electron microscope or coupled to the microscope and other user computing devices.

Figure 6:
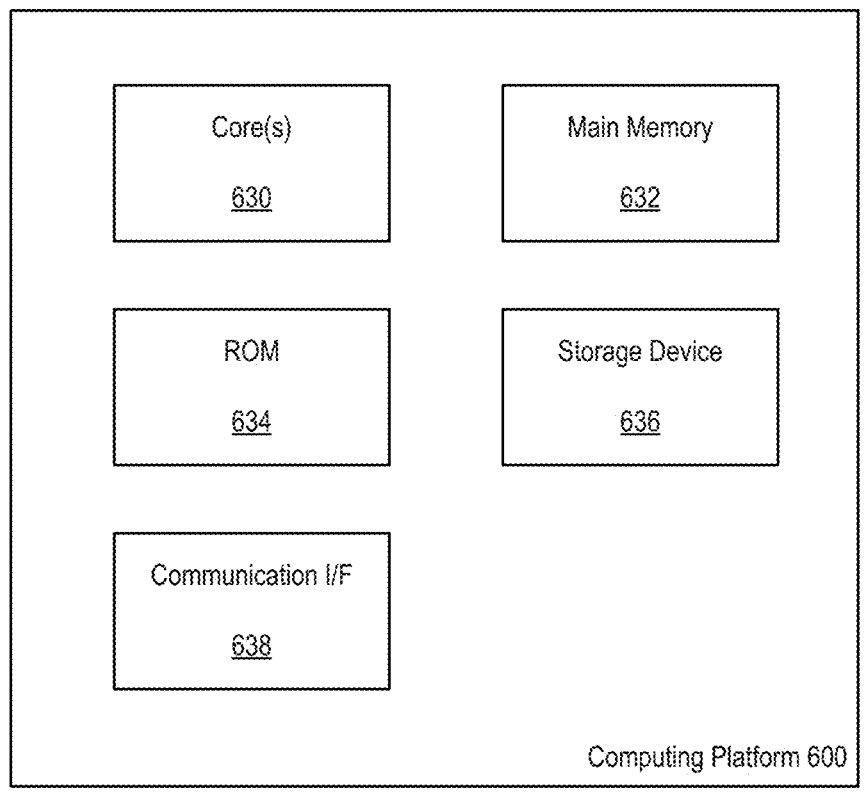
FIG. 6 is a block diagram that illustrates a computer system 600 upon which an embodiment of the invention may be implemented.

For example, FIG. 6 is a block diagram that illustrates a computer system 600 upon which an embodiment of the invention may be implemented. The computing system 600 may be an example of computing hardware included in CPM 100, for example. Computer system 600 at least includes a bus or other communication mechanism for communicating information, and a hardware processor 630 coupled with the bus (not shown) for processing information. Hardware processor 630 may be, for example, a general purpose microprocessor. The computing system 600 may be used to implement the methods and techniques disclosed herein, such as methods 201, 301, 401 and/or 501, and may also be used to obtain images and process said images with one or more filters/algorithms.

Computer system 600 also includes a main memory 632, such as a random access memory (RAM) or other dynamic storage device, coupled to the bus for storing information and instructions to be executed by processor 630. Main memory 632 also may be used for storing temporary variables or other intermediate information during execution of instructions to be executed by processor 630. Such instructions, when stored in non-transitory storage media accessible to processor 630, render computer system 600 into a special-purpose machine that is customized to perform the operations specified in the instructions.

Computer system 600 further includes a read only memory (ROM) 634 or other static storage device coupled to bus 640 for storing static information and instructions for processor 630. A storage device 636, such as a magnetic disk or optical disk, is provided and coupled to bus 640 for storing information and instructions.

Computer system 600 may be coupled via the bus to a display, such as a cathode ray tube (CRT), for displaying information to a computer user. An input device, including alphanumeric and other keys, is coupled to the bus for communicating information and command selections to processor 630. Another type of user input device is a cursor control, such as a mouse, a trackball, or cursor direction keys for communicating direction information and command selections to processor 630 and for controlling cursor movement on the display. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 630 executing one or more sequences of one or more instructions contained in main memory 632. Such instructions may be read into main memory 632 from another storage medium, such as storage device 636. Execution of the sequences of instructions contained in main memory 632 causes processor 630 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 636. Volatile media includes dynamic memory, such as main memory 632. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise the bus. Transmission media can also take the form of acoustic or light waves, such as those generated during radio-wave and infra-red data communications.

Computer system 600 also includes a communication interface 638 coupled to the bus. Communication interface 638 provides a two-way data communication coupling to a network link (not shown) that is connected to a local network, for example. As another example, communication interface 638 may be a local area network (LAN) card to provide a data communication connection to a compatible LAN. Wireless links may also be implemented. In any such implementation, communication interface 638 sends and receives electrical, electromagnetic or optical signals that carry digital data streams representing various types of information.

Computer system 600 can send messages and receive data, including program code, through the network(s), a network link and communication interface 638. In the Internet example, a server might transmit a requested code for an application program through Internet, ISP, local network and communication interface 638. The received code may be executed by processor 630 as it is received, and/or stored in storage device 636, or other non-volatile storage for later.

The techniques disclosed herein may be implemented in an electron microscope, such as a TEM, to improve image contrast by imparting phase change to unscattered electrons after they have passed through a sample. The added phase change to the passing electrons increases image contrast due to improving the contrast transfer function of the electron microscope. The disclosed techniques can be implemented via hardware additions to a microscope, such as arranging an optical cavity in a diffraction plane of the microscope, or a conjugate thereof. The optical cavity, which may be a Fabry-Perot cavity in some embodiments, receives high intensity optical energy and either forms a single optical pulse or a optical standing wave. The peak intensity of either the single wave or the antinodes of the standing wave provide pronderomotive potential to passing electrons, which imparts phase change. Depending on where the electrons pass in relation to the peak intensity, the amount of phase change can vary with the most phase change, e.g., $2\pi$ of phase, occurring at the peak intensity location. By directing the electron beam to pass through the optical pulse or standing wave at desired locations relative to or coincident with the optical peak, a desired amount of phase change can be imparted to the passing electrons. In some embodiments, the electron beam can be passed through multiple different locations of a standing wave or optical peak to vary the phase change, which may result in reducing or eliminating zeros of the contrast transfer function.

An example apparatus for implementing the techniques disclosed herein includes at least an electron source coupled to provide an electron beam to a sample, one or more deflectors coupled to reposition the electron beam in response to a control signal, an optical source coupled to provide an optical beam, the optical beam a high energy optical beam, an optical cavity coupled to receive the optical beam and to form at least one optical peak within the optical cavity, the optical cavity arranged at a diffraction plane of an electron microscope, and a controller coupled to at least the one or more deflectors, the controller including or coupled to non-transitory computer readable medium including code that, when executed by the controller, causes the controller to direct, by the one or more of the deflectors, the electron beam through the at least one optical peak at a first location, wherein the first location determines an amount of phase manipulation the optical peak imparts to an electron of the electron beam.

In some embodiments of the apparatus the first location is a peak intensity location of the optical peak.

In some embodiments of the apparatus the first location is a location with an intensity less than a peak intensity of the optical peak.

In some embodiments of the apparatus the at least one optical peak is formed from an optical pulse.

In some embodiments of the apparatus the at least one optical peak is part of an optical standing wave.

In some embodiments of the apparatus the optical source provides a continuous wave optical beam to the optical cavity to form the optical standing wave.

In some embodiments of the apparatus the optical cavity is a near concentric Fabry-Perot cavity.

In some embodiments of the apparatus the non-transitory computer readable medium further includes code that, when executed by the controller, causes the controller to direct the electron beam through the at least one optical peak at a second location, the second location being different than the first location, wherein the amount of phase manipulation the optical peak imparts to an electron of the electron beam at the second location is different than the amount of phase manipulation the optical peak imparts to an electron of the electron beam at the first location.

In some embodiments of the apparatus the at least one optical peak is part of an optical standing wave, and wherein the non-transitory computer readable medium further includes code that, when executed by the controller, causes the controller to direct the electron beam through a second optical peak, wherein the amount of phase manipulation the second optical peak imparts to an electron of the electron beam is different than the amount of phase manipulation the optical peak imparts to an electron of the electron beam at the first location of the at least one optical peak.

In some embodiments of the apparatus the at least one optical peak is part of an optical standing wave, and wherein the non-transitory computer readable medium further includes code that, when executed by the controller, causes the controller to dynamically raster the electron beam between the first location and a second location, the second location being outside of the at least one optical peak so that there is no interaction between an electron of the electron beam and the optical beam.

In some embodiments of the apparatus the at least one optical peak is part of an optical standing wave, and wherein the non-transitory computer readable medium further includes code that, when executed by the controller, causes the controller to move the electron beam along the optical standing wave to cause the electron beam to pass through a plurality of peaks and troughs of the optical standing wave, wherein interaction of the electron beam with different intensities along the scan causes the amount of phase manipulation to change based on the different intensities.

An example method to implement the disclosed techniques at least includes forming at least one optical peak in a diffraction plane of an electron microscope, and directing an electron beam through the at least one optical peak at a first location, wherein the first location determines an amount of phase manipulation the optical peak imparts to an electron of the electron beam.

In some embodiments of the method the first location is a peak intensity location of the optical peak.

In some embodiments of the method the first location is a location with an intensity less than a peak intensity of the optical peak.

In some embodiments of the method the at least one optical peak is formed from an optical pulse.

In some embodiments the method further comprises providing the optical pulse to an optical cavity arranged at the diffraction plane of the electron microscope.

In some embodiments of the method the at least one optical peak is part of an optical standing wave.

In some embodiments the method further comprises providing a continuous wave optical beam to an optical cavity arranged at the diffraction plane of the electron microscope to form the optical standing wave.

In some embodiments of the method the optical cavity is a Fabry-Perot cavity.

In some embodiments of the method the Fabry-Perot cavity is near concentric.

In some embodiments the method further comprises directing the electron beam through the at least one optical peak at a second location, the second location being different than the first location.

In some embodiments of the method the amount of phase manipulation the optical peak imparts to an electron of the electron beam at the second location is different than the amount of phase manipulation the optical peak imparts to an electron of the electron beam at the first location.

In some embodiments of the method the amount of phase manipulation the optical peak imparts to an electron of the electron beam at the second location is the same as the amount of phase manipulation the optical peak imparts to an electron of the electron beam at the first location In some embodiments the method further includes dynamically rastering the electron beam between the first location and a second location, the second location being outside of the at least one optical peak so that there is no interaction between an electron of the electron beam and the optical beam.

In some embodiments of the method the at least one optical peak is part of an optical standing wave formed at the diffraction plane, and the method further comprises moving the electron beam along the optical standing wave to cause the electron beam to pass through a plurality of peaks and troughs of the optical standing wave, wherein interaction of the electron beam with different intensities along the scan imparts the amount of phase manipulation to change based on the different intensities.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

What is claimed is:

1. An apparatus for image contrast optimization, the apparatus comprising:
    an electron source coupled to provide an electron beam to a sample;
    one or more deflectors coupled to reposition the electron beam in response to a control signal;
    an optical source coupled to provide an optical beam, the optical beam a high energy optical beam;
    an optical cavity coupled to receive the optical beam and to form at least one optical peak within the optical cavity, the optical cavity arranged at a diffraction plane of an electron microscope; and
    a controller coupled to at least the one or more deflectors, the controller including or coupled to non-transitory computer readable medium including code that, when executed by the controller, causes the controller to:
        direct, by the one or more of the deflectors, the electron beam through the at least one optical peak at a first location, wherein the first location determines an amount of phase manipulation the optical peak imparts to an electron of the electron beam.

2. The apparatus of claim 1, wherein the first location is a peak intensity location of the optical peak.

3. The apparatus of claim 1, wherein the first location is a location with an intensity less than a peak intensity of the optical peak.

4. The apparatus of claim 1, wherein the at least one optical peak is formed from an optical pulse.

5. The apparatus of claim 1, wherein the at least one optical peak is part of an optical standing wave.

6. The apparatus of claim 5, wherein the optical source provides a continuous wave optical beam to the optical cavity to form the optical standing wave.

7. The apparatus of claim 1, wherein the optical cavity is a near concentric Fabry-Perot cavity.

8. The apparatus of claim 1, wherein the non-transitory computer readable medium further includes code that, when executed by the controller, causes the controller to:
    direct the electron beam through the at least one optical peak at a second location, the second location being different than the first location, wherein the amount of phase manipulation the optical peak imparts to an electron of the electron beam at the second location is different than the amount of phase manipulation the optical peak imparts to an electron of the electron beam at the first location.

9. The apparatus of claim 1, wherein the at least one optical peak is part of an optical standing wave, and wherein the non-transitory computer readable medium further includes code that, when executed by the controller, causes the controller to:
    direct the electron beam through a second optical peak, wherein the amount of phase manipulation the second optical peak imparts to an electron of the electron beam is different than the amount of phase manipulation the optical peak imparts to an electron of the electron beam at the first location of the at least one optical peak.

10. The apparatus of claim 1, wherein the at least one optical peak is part of an optical standing wave, and wherein the non-transitory computer readable medium further includes code that, when executed by the controller, causes the controller to:
    dynamically raster the electron beam between the first location and a second location, the second location being outside of the at least one optical peak so that there is no interaction between an electron of the electron beam and the optical beam.

11. The apparatus of claim 1, wherein the at least one optical peak is part of an optical standing wave, and wherein the non-transitory computer readable medium further includes code that, when executed by the controller, causes the controller to:

move the electron beam along the optical standing wave to cause the electron beam to pass through a plurality of peaks and troughs of the optical standing wave, wherein interaction of the electron beam with different intensities along the scan causes the amount of phase manipulation to change based on the different intensities.

12. A method for image contrast optimization, the method comprising:
   forming at least one optical peak in a diffraction plane of an electron microscope; and
   directing an electron beam through the at least one optical peak at a first location, wherein the first location determines an amount of phase manipulation the optical peak imparts to an electron of the electron beam.

13. The method of claim 12, wherein the first location is a peak intensity location of the optical peak.

14. The method of claim 12, wherein the first location is a location with an intensity less than a peak intensity of the optical peak.

15. The method of claim 12, wherein the at least one optical peak is formed from an optical pulse.

16. The method of claim 15, further comprising providing the optical pulse to an optical cavity arranged at the diffraction plane of the electron microscope.

17. The method of claim 12, wherein the at least one optical peak is part of an optical standing wave.

18. The method of claim 17, further comprising providing a continuous wave optical beam to an optical cavity arranged at the diffraction plane of the electron microscope to form the optical standing wave.

19. The method of claim 18, wherein the optical cavity is a Fabry-Perot cavity.

20. The method of claim 19, wherein the Fabry-Perot cavity is near concentric.

21. The method of claim 12, further comprising:
   directing the electron beam through the at least one optical peak at a second location, the second location being different than the first location.

22. The method of claim 21, wherein the amount of phase manipulation the optical peak imparts to an electron of the electron beam at the second location is different than the amount of phase manipulation the optical peak imparts to an electron of the electron beam at the first location.

23. The method of claim 21, wherein the amount of phase manipulation the optical peak imparts to an electron of the electron beam at the second location is the same as the amount of phase manipulation the optical peak imparts to an electron of the electron beam at the first location.

24. The method of claim 12, further including:
   dynamically rastering the electron beam between the first location and a second location, the second location being outside of the at least one optical peak so that there is no interaction between an electron of the electron beam and the optical beam.

25. The method of claim 12, wherein the at least one optical peak is part of an optical standing wave formed at the diffraction plane, further comprising:
   moving the electron beam along the optical standing wave to cause the electron beam to pass through a plurality of peaks and troughs of the optical standing wave, wherein interaction of the electron beam with different intensities along the scan imparts the amount of phase manipulation to change based on the different intensities.

* * * * *